United States Patent [19]

Van Deursen

[11] 4,253,194

[45] Feb. 24, 1981

[54] RECEIVER INCLUDING A TUNING CIRCUIT HAVING A TRANSMITTER SEARCH

[75] Inventor: Theodorus H. Van Deursen, Eindhoven, Netherlands

[73] Assignee: U.S. Philips Corporation, New York, N.Y.

[21] Appl. No.: 5,121

[22] Filed: Jan. 22, 1979

Related U.S. Application Data

[63] Continuation of Ser. No. 781,140, Mar. 25, 1977, abandoned, which is a continuation of Ser. No. 619,032, Oct. 2, 1975, abandoned.

[30] Foreign Application Priority Data

Oct. 7, 1974 [NL] Netherlands ..................... 7413161

[51] Int. Cl.³ .............................................. H03J 7/18
[52] U.S. Cl. .................................. 455/161; 455/184; 455/185

[58] Field of Search .................... 334/16, 18, 26.29; 455/161, 168, 169, 164, 84, 185, 186

[56] References Cited

U.S. PATENT DOCUMENTS

| | | | |
|---|---|---|---|
| 3,750,030 | 7/1973 | Worcester | 325/468 |
| 3,803,494 | 4/1974 | Howell et al. | 325/469 |
| 3,824,475 | 7/1974 | Pflasterer | 325/470 |
| 3,895,303 | 7/1975 | Imazeki et al. | 325/470 |
| 3,940,702 | 2/1976 | Yoshimura et al. | 325/470 |
| 3,942,121 | 3/1976 | Bell et al. | 325/468 |

Primary Examiner—Jin F. Ng
Attorney, Agent, or Firm—Thomas A. Briody; William J. Streeter; Edward W. Goodman

[57] ABSTRACT

A receiver scanning circuit features a grouping of the stored frequencies, such as by geographical area or program content. Thus only one kind of station from a selected group need by stopped at, if only that kind of group is desired to be received. This greatly increases operator convenience.

5 Claims, 2 Drawing Figures

RECEIVER INCLUDING A TUNING CIRCUIT HAVING A TRANSMITTER SEARCH

This is a continuation, of application Ser. No. 781,140, filed Mar. 25, 1977, now abandoned, which is a continuation of Ser. No. 619,032, filed Oct. 2, 1975, abandoned.

BACKGROUND OF THE INVENTION

The invention relates to a receiver which includes a tuning circuit having a transmitter search device by means of which, during a search, a group from a plurality of tuning data stored in a memory can be scanned while the search can be stopped on tuning to a desired transmitter.

Netherlands Patent Application No. 7,212,838 describes a receiver of the above-mentioned type which contains potentiometers which serve as memory elements for tuning data and part of which can if desired be scanned by means of a counter circuit. The potentiometers of the said scanned group serve consecutively to supply a tuning voltage to a tunable section of the receiver until the receiver is tuned to a desired transmitter. The indication that the counter circuit, which in the relevant receiver serves as a search device, has reached the desired transmitter is obtained by means of an indicating lamp which lights up when the corresponding tuning data are supplied to the tunable section.

SUMMARY OF THE INVENTION

It is an object of the present invention to provide a receiver having a tuning circuit of greater ease of operation so that particularly vehicle radio receivers equipped with such a tuning circuit demand very little attention for operation.

A receiver of the above-mentioned type according to the invention is characterized in that the memory contains a group classification for transmitter tuning data while the receiver has a group selection circuit by means of which a group, from the group classification of transmitter tuning data to be scanned in a search can be selected, after which the search can be stopped by a reception condition signal produced on reception of a desired transmitter of the selected group.

In particular for vehicle receivers this is a very advantageous step, because such receivers must often be tuned from one transmitter the range of which they leave to another transmitter.

When the group classification of the tuning data in the memory for example is such that transmitters which radiate the same programm belong to the same group, the listener may uninterruptedly continue listening to this programme without operating any tuning member. The receiver then will each time automatically tune to a transmitter which provides sufficiently strong reception. Especially when a vehicle provided with such a receiver is driven in a large town such an arrangement is a great convenience, because under such conditions large field strength variations occur which then need not influence the programme received.

Classification of tuning data in groups of transmitters according to geographical situation, such as for example groups of transmitters classified according to regions of traffic information broadcasts, may be of great convenience when driving in a country having such regions, because the receiver continues to be tuned to a transmitter from a given region, until the listener selects a group comprising transmitters from another region when be knowns that he enters this other region.

The said step can further be of advantage for other receivers if the latter are able to receive groups of transmitters which are classified, for example, according to the nature of the music with they generally radiate.

DESCRIPTION OF THE DRAWINGS

Embodiments of the invention will now be described, by way of example, with reference to the accompanying diagrammatic drawings, in which.

DESCRIPTION OF THE PREFERRED EMBODIMENT

Figure 1:
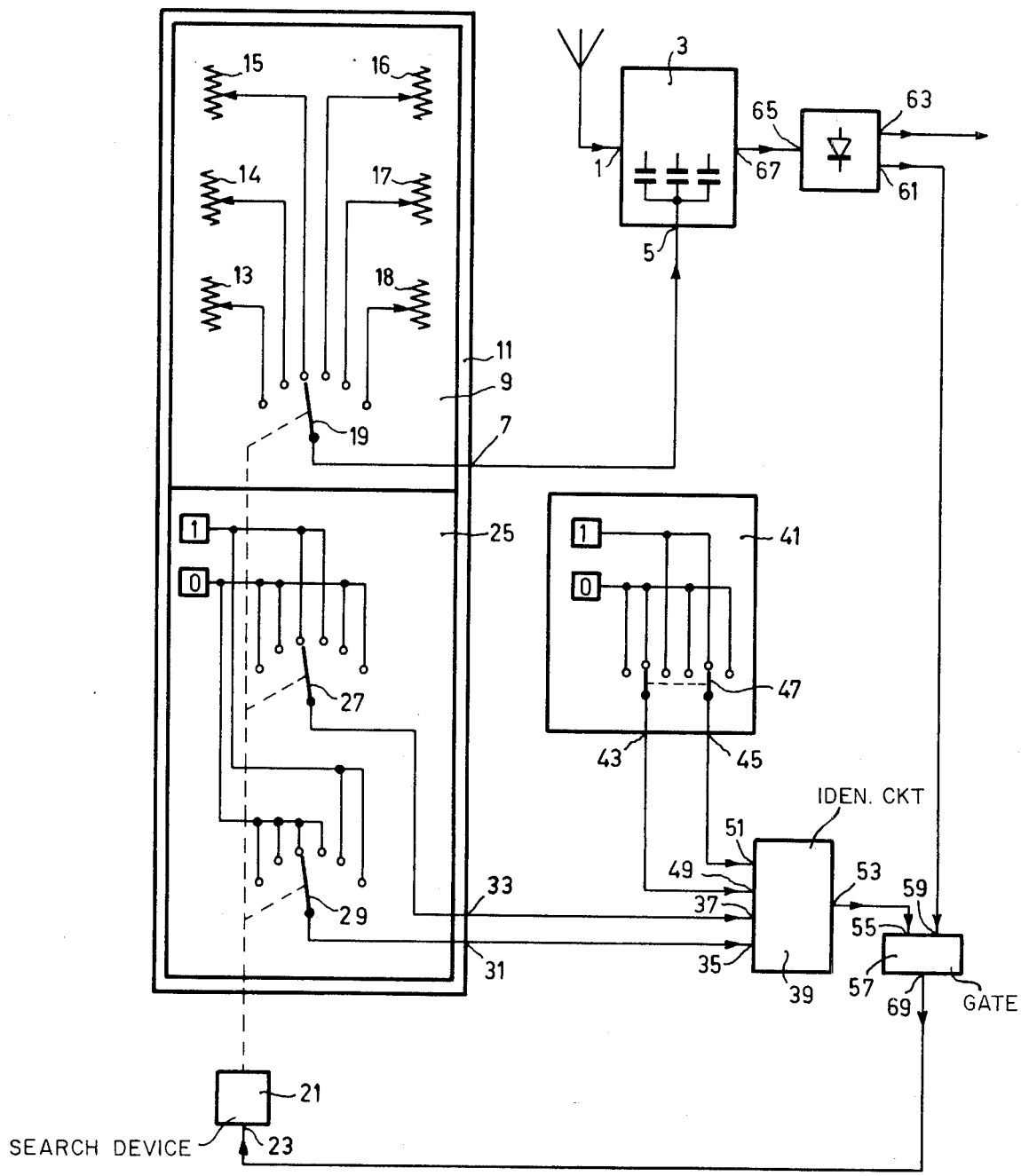
FIGS. 1 and 2 are block-schematic circuit diagrams of two embodiments of a receiver according to the invention.

Referring now to FIG. 1, a signal supplied by an antenna is applied to an input 1 of a tuning section 3 of a receiver. The tuning section 3 can be tuned by means of a tuning voltage applied to an input 5 from an output 7 of a transmitter tuning data section 9 of a memory 11. The transmitter tuning data section 9 of the memory 11 contains potentiometers 13, 14, 15, 16, 17 and 18 which each at one of the change-over terminals of a switch 19 supply a tuning voltage which can be selected by a pole of the switch 19 and supplied to the output 7.

The switch 19 can be operated by a transmitter search device 21 if at an input 23 of this device a signal is applied which indicates that no transmitter is being received.

The memory 11 further comprises a group mark section 25 having two switches 27 and 29 which are coupled to the switch 19 and are also controlled by the transmitter search device 21.

Two outputs 31 and 33 coupled to the poles of the switches 29, 27, respectively, supply, for each set of transmitter tuning data selected by the switch 19, an associated group mark to inputs 35, 37, respectively, of an identification circuit 39.

The group mark in this case is a voltage combination 00 in the first and the second positions of the switch arms of the switches 19, 27 and 29, a combination 01 in the third and the fourth positions and a combination 10 in the fifth and sixth positions. The tuning voltages of the potentiometers 13 and 14 belong to a group 00, those of the potentiometers 15 and 16 to a group 01 and those of the potentiometers 17 and 18 to a group 10.

By means of a group selection circuit 41, at outputs 43 and 45 of this circuit a voltage combination is obtainable which can be set by a switch 47 so that a group mark 00, 01 or 10 associated with a selected group is applied to two inputs 49 and 51 of the identification circuit, 39.

The identification circuit 39 at an output 53 produces an identification signal when the group mark selected by means of the switch 47 and applied to the inputs 49, 51 corresponds to the group mark at the inputs 35, 37 associated with the transmitter to which the receiver is tuned by means of the switch 19. This identification signal is applied to an input 55 of a gate circuit 57.

When a transmitter of sufficient field strength is received, a reception condition signal is applied to a further input 59 of the gate circuit 57 from an output 61 of a detection circuit 63 which via an input 65 is coupled to an output 67 of the tuning section 3 of the receiver.

If both the reception condition signal and the identification signal appear at the input 59, 55 of the gate circuit 57, this circuit at an output 69 produces a stop signal which is applied to the input 23 of the transmitter search device 21 and causes it to stop when the receiver is tuned to a transmitter from a group which is selected by the switch 47 and is received with sufficient strength.

When the reception condition signal at the input 59 of the gate circuit 57 collapses, the search device starts another search which can only stop if within the group determined by the switch 47 a transmitter of sufficient field strength is found.

Obviously the transmitter tuning section 9 of the memory 11 may be constructed so that a set of binary tuning data is supplied to the tuning section 3. The latter then may comprise, for example, a frequency synthesis circuit.

The set of group mark data supplied by the group mark section 25 may if desired be, for example, a frequency or an analogous voltage. In this case the identification circuit 39 must be adapted thereto. The group selection circuit 41 also may if desired by constructed so as to supply another type of group mark.

The switches 19, 27 and 29 in the memory 11 may in digital techniques take the form of shift registers, in which case the transmitter search device 21 may be a clock pulse generator.

In general, a signal which depends upon the field strength of the received transmitter will be used as a reception condition signal. Any circuit commonly used for such a purpose can be used in an appropriate manner.

In the embodiment described the number of groups to be selected is three. Obviously, this number may be chosen at will.

If the transmitter is designed so that the group classification of the tuning data is effected according to the geographic situation of the transmitters in given regions, the switch 47 may preferably comprise a number of control members, for example push-buttons, which correspond to these regions and with respect to their relative locations on a control panel are oriented according to the geographic situation of the regions.

The group selection circuit 41 may if desired have selection possibilities both according to type of programme and to geographical situation.

The group mark section 25 of the memory 11, the group selection circuit 41 and the identification circuit 39 can be greatly simplified if the tuning data of a group are joined to a sequence of positions of the switch 19. The switches 27 and 29 may then be replaced by one switch which, each time at the beginning of scanning of a next group, supplies a signal to the identification circuit 39 which, by means of a counter, can form an identification signal combination which can be compared with the output signal combination of the group selection circuit 41.

Figure 2:
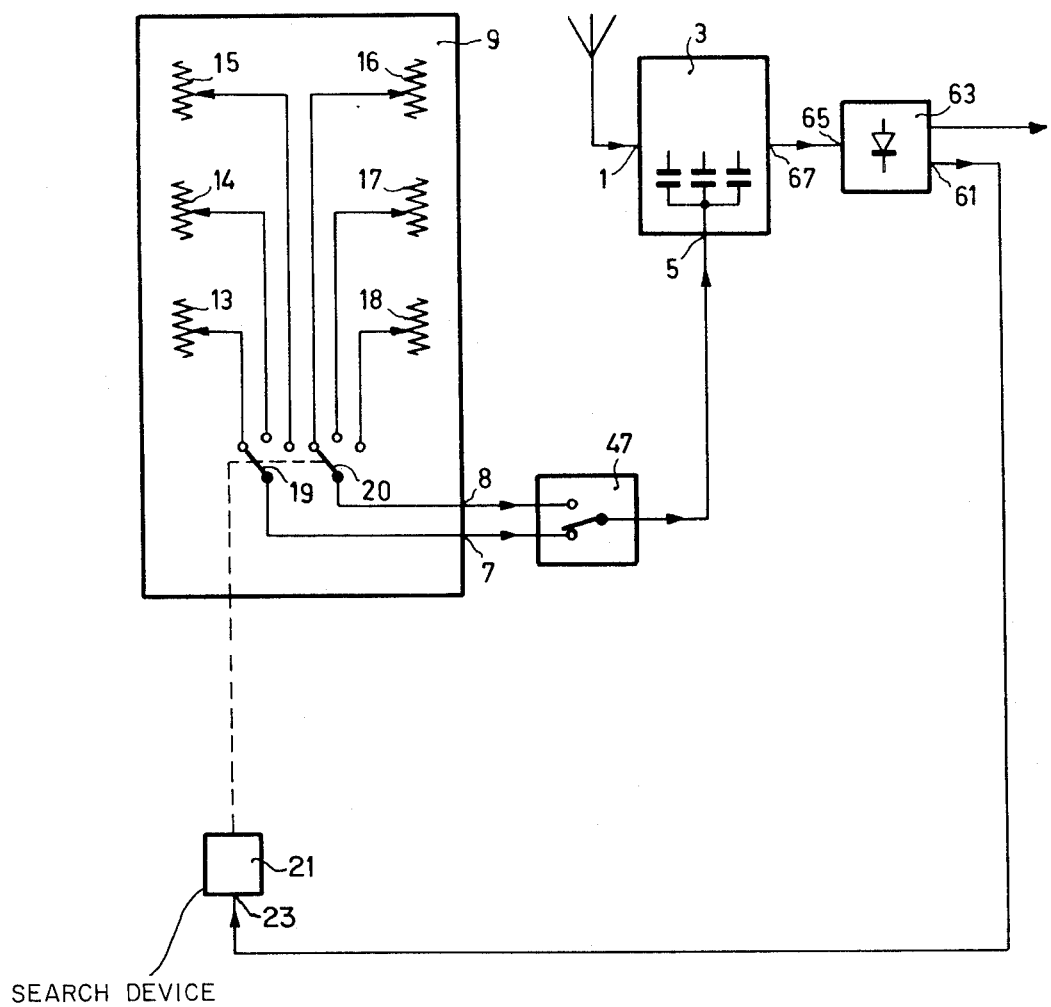

An even greater simplification of the circuit is obtainable if in the memory the tuning data are stored in groups which are adapted to be simultaneously scanned, as illustrated by the embodiment shown in FIG. 2.

In FIG. 2, in which corresponding element parts are designated by the same reference numerals as in FIG. 1, in the tuning data section 9 of the memory, the potentiometers 13, 14 and 15 of a first group are connected to a switch 19 and the potentiometers 16, 17 and 18 of a second group are connected to a switch 20. The switches 19 and 20 are both coupled to the search device 21 and during a search simultaneously scan the two groups of tuning data supplied by the potentiometers 13-18. An output 7, connected to the switch 19, and an output 8, connected to the switch 20, are connected to a group selection switch 47 so that a set of tuning data from a desired group can be selected and supplied to the tuning signal input 5.

Obviously the remarks made with respect to the embodiment shown in FIG. 1 apply to an embodiment as shown in FIG. 2 also.

What is claimed is:

1. A tuning circuit for a receiver comprising memory means for storing a plurality of groups of electrical quantities representing tuning frequencies, each of said groups comprising a plurality of electrical quantities representing tuning frequencies; search device means coupled to said memory means for scanning said groups; a group selection circuit means for selecting a group to be scanned, and means coupled to said search device means and to said group selection circuit means for stopping said scanning upon reception of a receive signal of sufficient amplitude; the memory including a group mark section means for storing group identification information and a tuning data section means for storing said electrical quantities representing tuning frequencies, said search device means scanning both said group mark section and said tuning data section, and said stopping means comprising a detector means for providing a reception condition signal upon said received signal having said sufficient amplitude, identification circuit means coupled to the group mark section of the memory and to said group selection circuit means for delivering an identification signal when the group mark section of the memory equals a group mark determined by the group section circuit, and a gate having inputs coupled to said detector and identification circuit means respectively and an output coupled to said search device means.

2. A tuning circuit as claimed in claim 1, wherein the receiver is a vehicle receiver and the group selection circuit is a programme-type selection circuit.

3. A tuning circuit as claimed in claim 1, wherein the receiver is a vehicle receiver and the group selection circuit is a geographical region selection circuit which permits a selection from groups of transmitters classified according to geographical situation.

4. A tuning circuit as claimed in claim 3, wherein the group selection circuit means includes a control panel comprising group selection members arranged according to the geographical situations of the groups.

5. A tuning circuit for a receiver comprising memory means which include a plurality of simultaneously scannable groups of the electrical quantities representing tuning data frequencies, said memory means further including a separate output for each of said groups; search device means coupled to said memory means for scanning said tuning data frequencies in said scannable groups; a scanning group selection circuit means coupled to said separate outputs of said memory means for selecting with one switching action at will one of said scannable groups to be scanned without changing the group arrangement of the tuning data frequencies of the memory means; and means coupled to said search device means and to said group selection circuit means for stopping said scanning upon reception of a received signal of sufficient amplitude.

* * * * *